US012401326B2

(12) United States Patent
Dutta et al.

(10) Patent No.: US 12,401,326 B2
(45) Date of Patent: Aug. 26, 2025

(54) REDUCING PARASITIC CAPACITANCE

(71) Applicant: QUALCOMM Incorporated, San Diego, CA (US)

(72) Inventors: Ranadeep Dutta, Del Mar, CA (US); Abdellatif Bellaouar, Richardson, TX (US); Chuan-Cheng Cheng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 419 days.

(21) Appl. No.: 17/932,403

(22) Filed: Sep. 15, 2022

(65) Prior Publication Data

US 2024/0097619 A1    Mar. 21, 2024

(51) Int. Cl.
H03F 1/26        (2006.01)
H03F 3/45        (2006.01)

(52) U.S. Cl.
CPC .......... *H03F 1/26* (2013.01); *H03F 3/45475* (2013.01); *H03F 2200/372* (2013.01)

(58) Field of Classification Search
CPC .. H03F 1/26; H03F 3/45475; H03F 2200/372; H03F 2200/294; H03F 1/223; H03F 3/195; H03F 3/45188; H01L 23/5223; H01L 21/823475; H01L 27/088; H01L 27/0629; H01L 27/0207
USPC ........................................................ 330/310
See application file for complete search history.

(56) References Cited

U.S. PATENT DOCUMENTS

| 10,340,289 B2 | 7/2019 | Dutta et al. |
| 2004/0120175 A1* | 6/2004 | Schrom ............... H01L 27/0207 257/E27.029 |
| 2015/0340997 A1 | 11/2015 | Kato et al. |
| 2021/0218376 A1* | 7/2021 | Park .................... H03F 3/45183 |

OTHER PUBLICATIONS

Qualcomm CDMA Technologies: "QMOS: Interdigitated RF PA Device", IDF No. 161275, Nov. 24, 2015, pp. 1-16.
Cassan D.J., et al., "A 1-V Transformer-Feedback Low-Noise Amplifier for 5-GHz Wireless LAN in 0.18-μm CMOS", IEEE Journal of Solid-State Circuits, vol. 38, No. 3, Mar. 2003, pp. 427-435.

(Continued)

*Primary Examiner* — Andrea Lindgren Baltzell
*Assistant Examiner* — Jose E Pinero
(74) *Attorney, Agent, or Firm* — Smith, Tempel, Blaha LLC

(57) ABSTRACT

An apparatus is disclosed for reducing parasitic capacitance. In an example aspect, an apparatus includes an amplifier having a differential cascode configuration. Each stack of the amplifier includes a first transistor configured to operate as an input stage and a second transistor configured to operate as a cascode stage. The first and second transistors each include two channel terminal regions having a doping type that is uniform across the two channel terminal regions. Surfaces of first channel terminal regions of the first and second transistors abut a first and second quantity of electrical contacts, respectively. Second channel terminal regions of the first and second transistors form a floating region at a floating node. Each of the first quantity of electrical contacts and the second quantity of electrical contacts is greater than a third quantity of electrical contacts abutting a surface of the floating region.

23 Claims, 10 Drawing Sheets

(56) References Cited

OTHER PUBLICATIONS

Partial International Search Report—PCT/US2023/072197—ISA/EPO—Nov. 23, 2023, 9 pages.
Pornpromlikit, "CMOS RF Power Amplifier Design Approaches for Wireless Communications", Jan. 2010, 127 pages.
International Search Report and Written Opinion—PCT/US2023/072197—ISA/EPO—Feb. 29, 2024, 19 pages.
Khalili M.S., et al., "A Capacitor Cross-Coupled Differential Cascade Low-Noise Amplifier", 2012 IEEE International Conference on Electronics Design, Systems and Applications (ICEDSA), IEEE, Nov. 5, 2012, pp. 212-215, XP032383757, Chapters III-V, p. 213, Left-hand Column—p. 215, Left-hand Column, Figures 3-8, Table II.
Wang W., et al., "Capacitor Cross-Coupled Fully-differential CMOS Folded Cascode LNAs with Ultra Low Power Consumption", Wireless Personal Communications, vol. 78, No. 1, Apr. 7, 2014, 11 Pages, XP93132074, NL, p. 51-p. 53, Figures 7-11, Tables 1,2.

\* cited by examiner

REDUCING PARASITIC CAPACITANCE

TECHNICAL FIELD

This disclosure relates generally to wireless transceivers and other components that employ amplifiers and, more specifically, to reducing parasitic capacitance within an amplifier.

BACKGROUND

To increase transmission rates and throughput, cellular and other wireless networks are using signals with higher frequencies and smaller wavelengths. As an example, $5^{th}$ generation (5G)-capable devices or next-generation wireless local area network (WLAN)-capable devices communicate with networks using frequencies that include those at or near the extremely high frequency (EHF) spectrum (e.g., frequencies greater than 24 gigahertz (GHz)) with wavelengths at or near millimeter wavelengths (mmW). However, these signals present various technological challenges, such as higher path loss as compared to signals for earlier generations of wireless communications. In certain scenarios, it can be difficult for a mmW wireless signal to travel far enough to make cellular or WLAN communications feasible at these higher frequencies.

SUMMARY

An apparatus is disclosed that reduces parasitic capacitance. In example aspects, an amplifier with a differential cascode configuration has an input stage and a cascode stage, which are coupled together at a floating node. Channel terminal regions of the input stage and the cascode stage form a floating region at the floating node. To manage the parasitic capacitance between a gate terminal of the input stage and the floating region, few (if any) electrical contacts are deposited on a surface of the floating region. As such, a smaller quantity of electrical contacts abut the floating region compared to other channel terminal regions of the input stage and the cascode stage. By having fewer electrical contacts within the floating region, the parasitic capacitance of the amplifier can be smaller than other amplifier designs with larger quantities of electrical contacts within the floating region. Also, a footprint of the amplifier can be smaller than other amplifier designs that use neutralizing capacitors.

In an example aspect, an apparatus for amplification is disclosed. The apparatus includes an amplifier having a differential cascode configuration. The amplifier includes at least two stacks. Each stack of the at least two stacks includes a first transistor and a second transistor. The first transistor is configured to operate as an input stage of the amplifier. The second transistor is coupled to the first transistor at a floating node and is configured to operate as a cascode stage of the amplifier. The first and second transistors each include two channel terminal regions having a doping type that is uniform across the two channel terminal regions. The two channel terminal regions include a first channel terminal region and a second channel terminal region. A surface of the first channel terminal region of the first transistor abuts a first quantity of electrical contacts. A surface of the first channel terminal region of the second transistor abuts a second quantity of electrical contacts. The second channel terminal regions of the first and second transistors form a floating region at the floating node. Each of the first quantity of electrical contacts and the second quantity of electrical contacts is greater than a third quantity of electrical contacts abutting a surface of the floating region.

In an example aspect, an apparatus for amplification is disclosed. The apparatus includes means for amplifying a differential signal using a differential cascode configuration. The means for amplifying includes an input stage and a cascode stage, which is coupled to the input stage at a floating node. The input stage and the cascode stage each include two channel terminal regions having a doping type that is uniform across the two channel terminal regions. One of the two channel terminal regions of the input stage and one of the two channel terminal regions of the cascode stage forming a floating region at the floating node. The apparatus also includes means for setting a parasitic capacitance between a gate terminal of the input stage and the one of the two channel terminal regions of the input stage based on a quantity of electrical contacts that abut a surface of the floating region.

In an example aspect, an apparatus for amplification is disclosed. The apparatus includes an amplifier having a differential cascode configuration. The amplifier includes at least two stacks. Each stack of the at least two stacks includes a first transistor and a second transistor. The first transistor is configured to operate as an input stage of the amplifier. The second transistor is coupled to the first transistor at a floating node and is configured to operate as a cascode stage of the amplifier. The first transistor and the second transistor each include two channel terminal regions having a doping type that is uniform across the two channel terminal regions. The two channel terminal regions include a first channel terminal region and a second channel terminal region. The second channel terminal regions of the first and second transistors form a floating region at the floating node. The floating region includes an electrical-contact-free region.

In an example aspect, an apparatus is disclosed. The apparatus includes an amplifier having a differential cascode configuration. The amplifier includes at least two stacks. Each stack of the at least two stacks includes a first transistor and a second transistor. The first transistor is configured to operate as an input stage of the amplifier. The second transistor is coupled to the first transistor at a floating node and is configured to operate as a cascode stage of the amplifier. The amplifier also includes a first capacitor and a second capacitor. The first capacitor is coupled between a gate of the first transistor of a first stack of the at least two stacks and the floating node of a second stack of the at least two stacks. The second capacitor is coupled between a gate of the first transistor of the second stack and the floating region of the first stack. The first transistor and the second transistor each include two channel terminal regions having a doping type that is uniform across the two channel terminal regions. The two channel terminal regions include a first channel terminal region and a second channel terminal region. Surfaces of the second channel terminal regions of the first and second transistors form a floating region at the floating node. Each of a quantity of electrical contacts abutting the first channel terminal region of the first transistor and a quantity of electrical contacts abutting the first channel terminal region of the second transistor is greater than a quantity of electrical contacts abutting a surface of the floating region.

DETAILED DESCRIPTION

Cellular and other wireless networks can use signals with higher frequencies and smaller wavelengths to increase transmission rates and throughput. Signals within the extremely high frequency (EHF) spectrum (e.g., frequencies greater than 24 gigahertz (GHz)) with wavelengths at or near millimeter wavelengths, however, experience higher path loss compared to signals at lower frequency ranges. As such, it can be difficult for a mmW wireless signal to travel far enough to make cellular or WLAN communications feasible at these higher frequencies.

Electronic devices can employ amplifiers to amplify signals that are transmitted or received. Performance of an amplifier depends on several factors, including an amount of parasitic capacitance that is present within the amplifier. Parasitic capacitance refers to an unwanted capacitive effect that forms between two parts that are in close proximity to one another and have different voltages. Within the amplifier, the parasitic capacitance can degrade output power, gain, efficiency, linearity, and/or stability, particularly at frequencies within the extremely high frequency spectrum.

Some techniques connect neutralizing capacitors to transistors within an amplifier to reduce the amount of parasitic capacitance associated with the transistors. The neutralizing capacitors, however, can increase a footprint of the amplifier. It can be challenging to reduce parasitic capacitance while keeping a footprint of the amplifier sufficiently small to fit within space-constrained devices, such as portable electronic devices like smartphones or wearable devices. Further, amplifiers with larger footprints result in larger integrated circuits that cost more.

To address this challenge, example techniques for reducing parasitic capacitance are described. In example aspects, an amplifier with a differential cascode configuration has an input stage and a cascode stage, which are coupled together at a floating node. Channel terminal regions of the input stage and the cascode stage form a floating region at the floating node. To manage the parasitic capacitance between a gate terminal of the input stage and the floating region, few (if any) electrical contacts are deposited on a surface of the floating region. As such, a smaller quantity of electrical contacts abut the floating region compared to other channel terminal regions of the input stage and the cascode stage. By having fewer electrical contacts within the floating region, the parasitic capacitance of the amplifier can be smaller than other amplifier designs with larger quantities of electrical contacts within the floating region. Also, a footprint of the amplifier can be smaller than other amplifier designs that use neutralizing capacitors.

Figure 1:
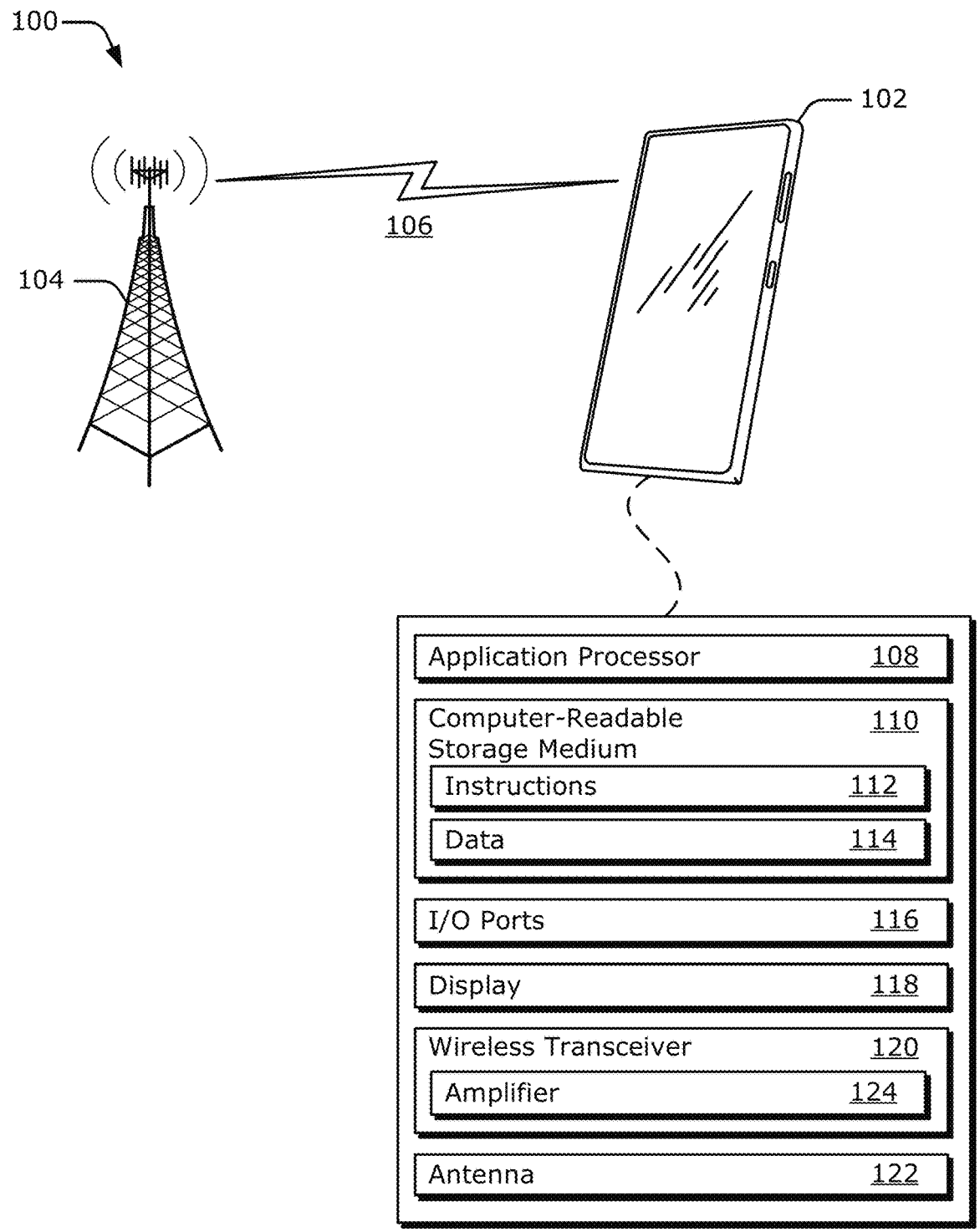
FIG. 1 illustrates an example operating environment for reducing parasitic capacitance.

FIG. 1 illustrates an example environment 100 for operating an amplifier that reduces parasitic capacitance. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as $2^{nd}$-generation (2G), $3^{rd}$-generation (3G), $4^{th}$-generation (4G), or $5^{th}$-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, ultra-wideband (UWB) network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

In the example shown in FIG. 1, the wireless transceiver 120 includes at least one amplifier 124. The amplifier 124 can implement aspects of reducing parasitic capacitance, which refers to the act, condition/state, or configuration of reducing and/or cancelling parasitic capacitance by an appreciable level, such as by a sufficient amount so that a target performance is realized. By reducing parasitic capacitance, for instance, the amplifier 124 can realize a target output power, a target gain, a target efficiency, a target linearity, and/or a target stability for wireless applications, including those that utilize frequencies within the extremely high frequency spectrum. The amplifier 124 is further described with respect to FIG. 2.

Figure 2:
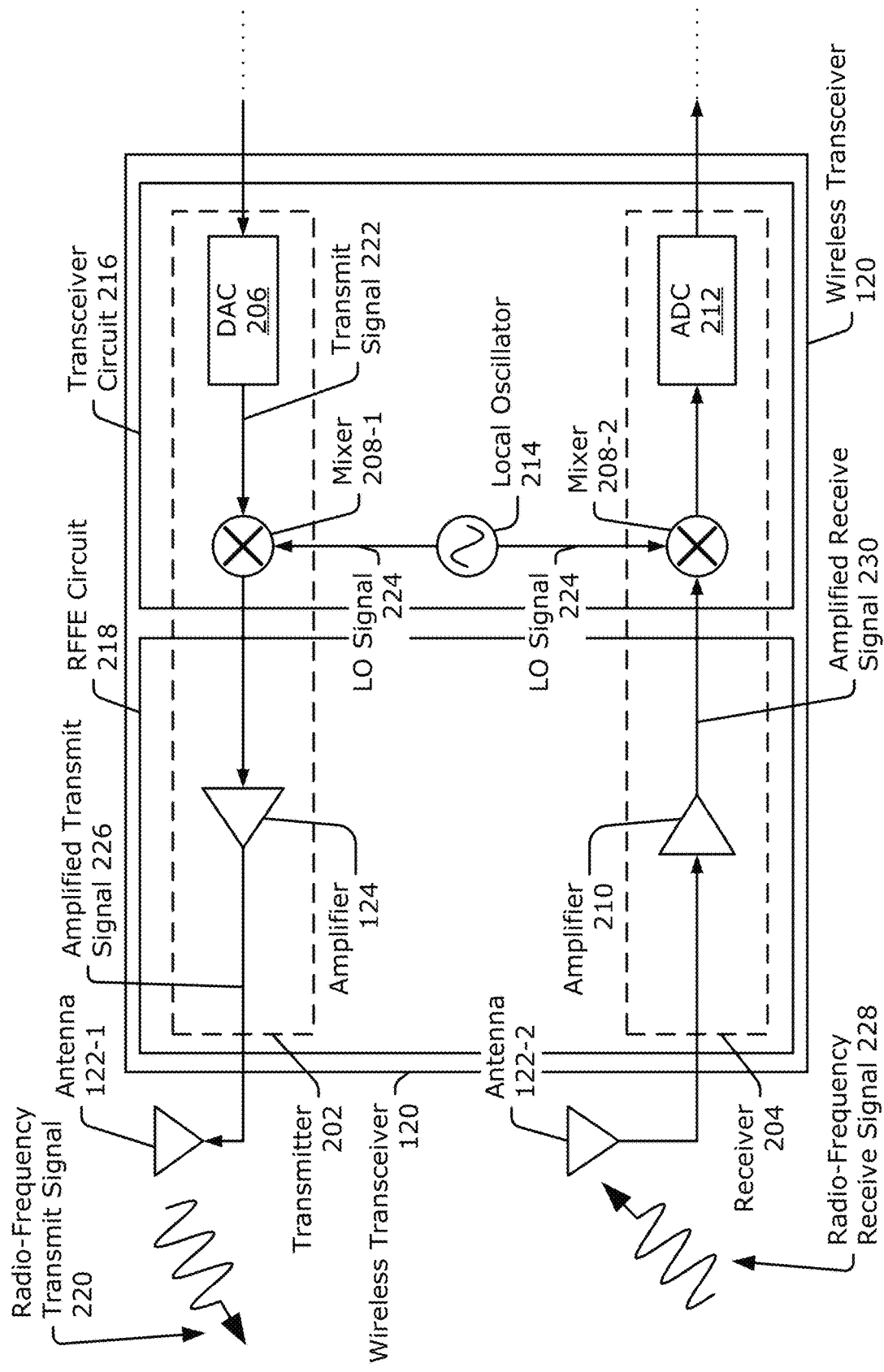
FIG. 2 illustrates an example wireless transceiver including at least one amplifier that reduces parasitic capacitance.

FIG. 2 illustrates an example wireless transceiver 120. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be connected to a same antenna through a duplexer (not shown) or some other interface (e.g., for a time-division duplexing (TDD) system such as many millimeter-wave systems). The transmitter 202 is shown to include at least one digital-to-analog converter 206 (DAC 206), at least one first mixer 208-1, and at least one amplifier 124 (e.g., a power amplifier). The receiver 204 includes at least one amplifier 210 (e.g., a low-noise amplifier), at least one second mixer 208-2, and at least one analog-to-digital converter 212 (ADC 212). The first mixer 208-1 and the second mixer 208-2 are coupled to a local oscillator 214. Although not explicitly shown, the digital-to-analog converter 206 of the transmitter 202 and the analog-to-digital converter 212 of the receiver 204 can be coupled to the application processor 108 (of FIG. 1) or another processor associated with the wireless transceiver 120 (e.g., a modem).

In some implementations, the wireless transceiver 120 is implemented using multiple circuits (e.g., multiple integrated circuits), such as a transceiver circuit 216 and a radio-frequency front-end (RFFE) circuit 218. As such, the components that form the transmitter 202 and the receiver 204 are distributed across these circuits. As shown in FIG. 2, the transceiver circuit 216 includes the digital-to-analog converter 206 of the transmitter 202, the mixer 208-1 of the transmitter 202, the mixer 208-2 of the receiver 204, and the analog-to-digital converter 212 of the receiver 204. In other implementations, the digital-to-analog converter 206 and the analog-to-digital converter 212 can be implemented on another separate circuit that includes the application processor 108 or the modem. The radio-frequency front-end circuit 218 includes the amplifier 124 of the transmitter 202 and the amplifier 210 of the receiver 204.

During transmission, the transmitter 202 generates a radio-frequency transmit signal 220, which is transmitted using the antenna 122-1. To generate the radio-frequency transmit signal 220, the digital-to-analog converter 206 provides a transmit signal 222 to the first mixer 208-1. The transmit signal 222 can be a baseband signal or an intermediate-frequency signal. The first mixer 208-1 upconverts the transmit signal 222 using a local oscillator (LO) signal 224 provided by the local oscillator 214. The first mixer 208-1 generates an upconverted version of the transmit signal 222, which can be a radio-frequency signal. The amplifier 124 amplifies the upconverted transmit signal 222 and passes an amplified transmit signal 226 to the antenna 122-1 for transmission. The transmitted amplified transmit signal 226 is represented by the radio-frequency transmit signal 220.

During reception, the antenna 122-2 receives a radio-frequency receive signal 228 and passes the radio-frequency receive signal 228 to the receiver 204. The amplifier 210 of the receiver 204 amplifies the radio-frequency receive signal 228 and passes an amplified receive signal 230 to the second mixer 208-2. The second mixer 208-2 downconverts the amplified receive signal 230 using the local oscillator signal 224. The analog-to-digital converter 212 converts the downconverted amplified receive signal 230 into a digital signal, which can be processed by the application processor 108 or another processor associated with the wireless transceiver 120 (e.g., the modem).

In the depicted configuration, the amplifier 124 implements a power amplifier within the transmitter 202. The amplifier 124, however, is not limited to implementations associated with power amplifiers. In general, the amplifier 124 can implement other types of amplifiers within the radio-frequency front-end circuit 218 and/or the transceiver circuit 216. For instance, the amplifier 124 can implement a low-noise amplifier within the receiver 204. Additionally or alternatively, the amplifier 124 can implement another amplifier, such as a variable-gain amplifier, within the transmitter 202 or the receiver 204.

FIG. 2 illustrates one example configuration of the wireless transceiver 120. Other configurations of the wireless transceiver 120 can support multiple frequency bands and share an antenna 122 across multiple transceivers. One of ordinary skill in the art can appreciate the variety of other configurations for which amplifier 124 may be included. For example, the amplifier 124 can be implemented within a wireless transceiver 120 that has a superheterodyne architecture or a direct-conversion architecture (or a zero-intermediate-frequency architecture). In some aspects, the amplifier 124 can be integrated within active phase shifters of the wireless transceiver 120. The amplifier 124 can have a differential cascode configuration, which is further described with respect to FIG. 3.

Figure 3:
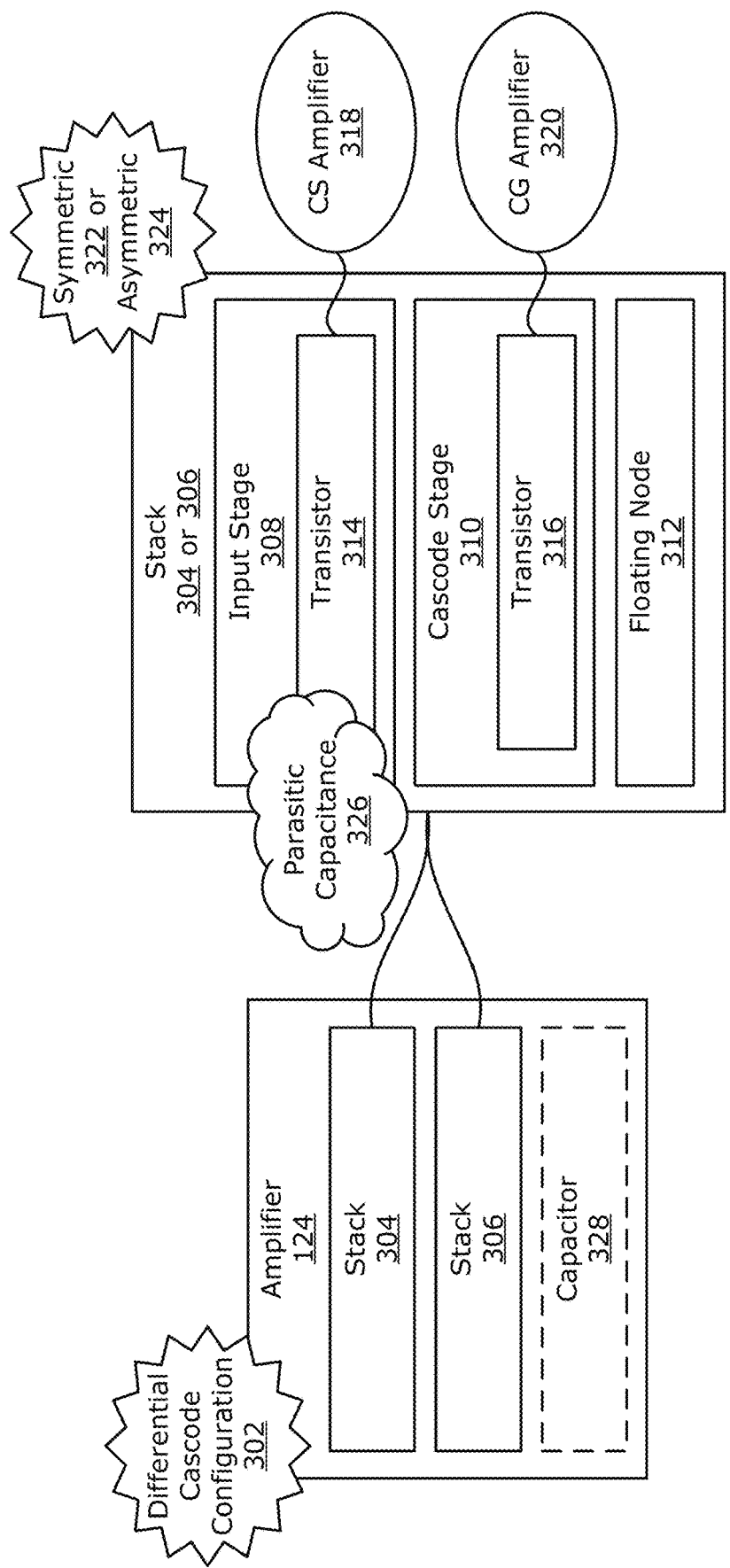
FIG. 3 illustrates example components of an amplifier that reduces parasitic capacitance.

FIG. 3 illustrates example components of the amplifier 124, which has a differential cascode configuration 302. In particular, the amplifier 124 includes at least two stacks (or at least one pair of stacks), which are represented by a first stack 304 and a second stack 306. Each stack 304 and 306 represents an amplification branch of the amplifier 124. The two stacks 304 and 306 enable the amplifier 124 to accept a differential input signal (e.g., two complementary input signals or two input signals with opposite polarities) and generate a differential output signal (e.g., two complementary output signals or two output signals with opposite polarities). The differential output signal is amplified relative to the differential input signal.

Each stack 304 and 306 includes an input stage 308 and a cascode stage 310, which are coupled together at a floating node 312. The floating node 312 has a floating potential (e.g., a floating voltage) because the floating node 312 is not directly connected to a ground or a fixed voltage, such as a supply voltage. As such, the voltage at the floating node 312 can vary during operation of the amplifier 124. The floating node 312 can also be referred to as an internal node. As an internal node, the floating node 312 is not connected to any components of the wireless transceiver 120 or voltage sources that are external to the amplifier 124. In this way, the floating node 312 differs from the input node 502 and the output node 506, which are connected to other components of the wireless transceiver 120.

For each stack 304 or 306, the input stage 308 can be implemented using at least one transistor 314, and the cascode stage 310 can be implemented using at least one other transistor 316. In an example implementation, the transistor 314 is configured as a common-source amplifier 318 (CS amplifier 318), and the transistor 316 is configured as a common-gate amplifier 320 (CG amplifier 320). The transistors 314 and 316 can be implemented using an n-channel metal-oxide-semiconductor field-effect transistor (NMOSFET), a p-channel metal-oxide-semiconductor field-effect transistor (PMOSFET), an extended-drain NMOSFET (ED-NMOSFET), a super-low threshold-voltage NMOSFET (SLVT-NMOSFET), a bipolar junction transistor (BJT), another type of transistor, or combinations thereof.

In an example implementation, the transistors 314 and 316 within each stack 304 and 306 are symmetric 322. This means the transistor 314 of the input stage 308 and the transistor 316 of the cascode stage 310 are a same type of transistor. For example, the transistors 314 and 316 can both be implemented using NMOSFETs. In another example implementation, the transistors 314 and 316 within each stack 304 and 306 are asymmetric 324. This means the transistor 314 of the input stage 308 and the transistor 316 of the cascode stage 310 are different types of transistors (e.g., different types of NMOSFETs). For example, the transistor 314 can be implemented using a SLVT-NMOSFET, and the transistor 316 can be implemented using an ED-NMOSFET.

The transistor 314 of the input stage 308 has parasitic capacitance 326. To at least partially reduce this parasitic capacitance 326, few (if any) electrical contacts can be disposed on a surface of a floating region associated with the floating node 312, as further described with respect to FIGS. 4 and 5. Significantly reducing or eliminating the electrical contacts disposed on the surface of the floating region can reduce the parasitic capacitance 326 by up to 60% in some implementations.

Optionally, the amplifier 124 can include two or more capacitors 328 (or neutralization capacitors) to further reduce at least a portion of the parasitic capacitance 326. The capacitors 328 are coupled between the stacks 304 and 306, as further described with respect to FIGS. 8 and 9. Capacitances of the capacitors 328 can be appropriately set to at least partially reduce the parasitic capacitance 326. To avoid increasing a footprint of the amplifier 124, the capacitors 328 can be integrated within a layout of the stacks 304 and 306. In other words, the capacitors 328 can be formed using metal interconnect layers associated with the stacks 304 and 306. By not using distinct, external capacitors, the capacitors 328 can provide additional parasitic-capacitance-reduction capabilities without significantly increasing a footprint of the amplifier 124. The transistors 314 and 316 are further described with respect to FIG. 4.

Figure 4:
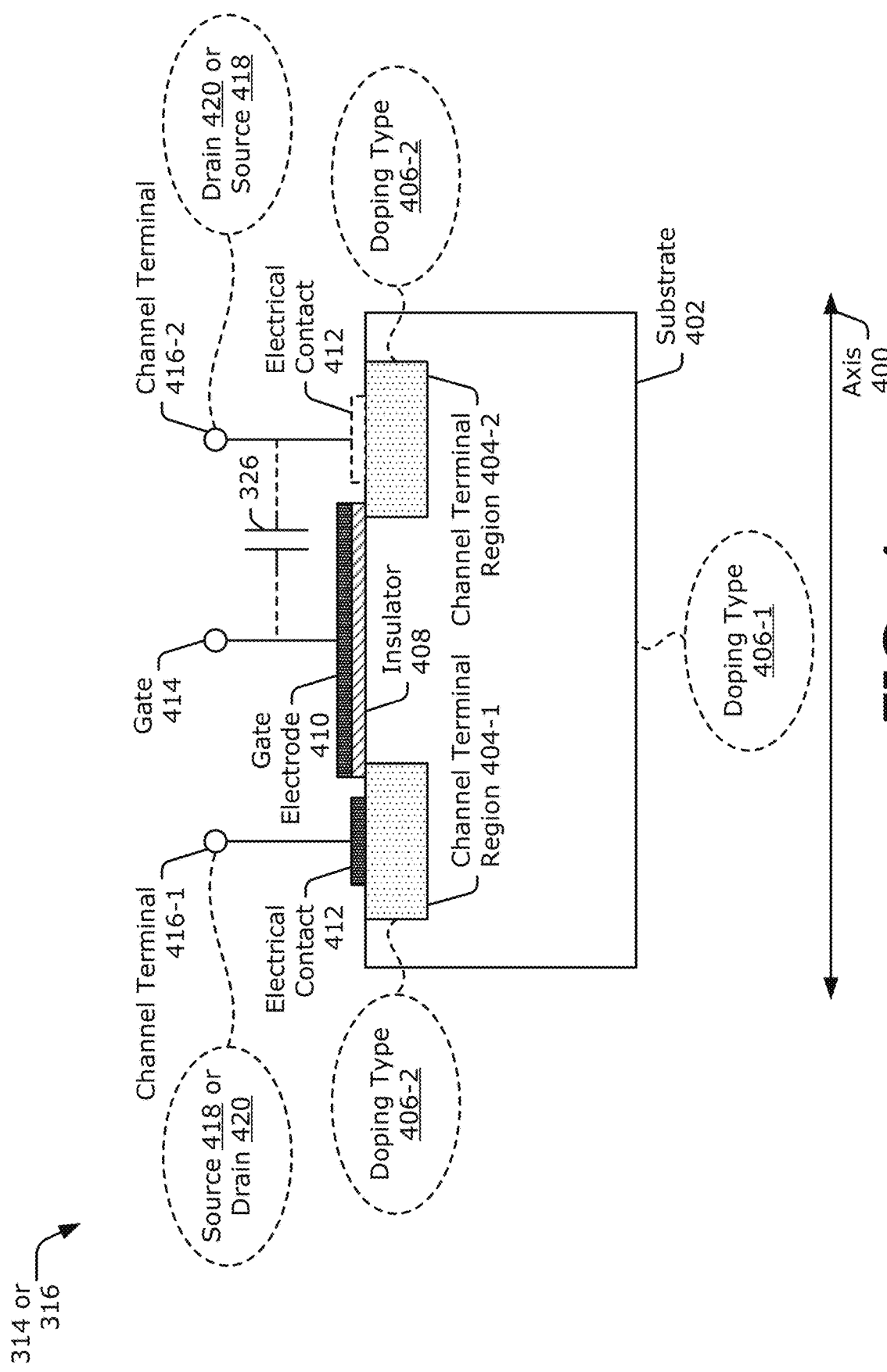
FIG. 4 illustrates example components of a transistor.

FIG. 4 illustrates example components of the transistor 314 or 316. In the depicted configuration, the transistor 314 or 316 is implemented as a metal-oxide-semiconductor field-effect transistor (MOSFET). Other implementations of the transistors 314 and 316 are also possible. The transistor 314 or 316 includes at least one substrate 402 (or body) with at least two channel terminal regions 404-1 and 404-2, which are arranged or positioned along an axis 400. The substrate 402 can be a single-crystal silicon wafer. In general, the substrate 402 provides physical support for components of the amplifier 124. Sometimes the substrate 402 represents a substrate of an integrated circuit that includes the amplifier 124. An example integrated circuit can include the radio-frequency front-end circuit 218 and/or the transceiver circuit 216. The substrate 402 has a first doping type 406-1.

The two channel terminal regions 404-1 and 404-2 have a second doping type 406-2, which differs from the first doping type 406-1 of the substrate 402. Consider an example in which the transistor 314 or 316 represents an NMOSFET. In this case, the doping type 406-1 of the substrate 402 represents a p-type doping, and the doping type 406-2 of the two channel terminal regions 404-1 and 404-2 represent an n-type doping. The doping type (e.g., n-type or p-type doping) within each of the two channel terminal regions 404-1 and 404-2 is uniform. Here, the term "uniform" means that both channel terminal regions 404-1 and 404-2 have a single doping type, such as an n+ doping type, and the profile of the channel terminal regions 404-1 and 404-2 are approximately similar.

The transistor 314 or 316 also includes at least one insulator 408, which can be grown or disposed on a surface of the substrate 402. The insulator 408 covers a portion of the surface of the substrate 402 that is between the two channel terminal regions 404-1 and 404-2. In an example implementation, the insulator 408 is formed using oxide, such as silicon dioxide ($SiO_2$). A conducting material, such as metal, is deposited on a surface of the insulator 408 to form a gate electrode 410.

At least one electrical contact 412 is deposited on a surface of at least one of the channel terminal regions 404, such as the channel terminal region 404-1 in FIG. 4. In general, any quantity of electrical contacts 412 can be deposited on the surface of the channel terminal region 404-1. For example, the quantity of electrical contacts 412 can be 1, 2, 4, 10, 20, 100, and so forth. An electrical contact 412 may or may not be deposited on a surface of the other channel terminal region 404-2, as further described below.

The transistor 314 or 316 can be considered a three-terminal device, with the terminals including a gate 414 (e.g., a gate terminal) and two channel terminals 416-1 and 416-2. The channel terminals 416-1 and 416-2 can each represent a source 418 (e.g., a source terminal) or a drain 420 (e.g., a drain terminal). In example implementations in which the transistor 314 implements the common-source amplifier 318 and the transistor 316 implements the common-gate amplifier 320, the channel terminal 416-1 represents the source 418 of the transistor 314, and the channel terminal 416-2 represents the drain 420 of the transistor 314. For the transistor 316, the channel terminal 416-1 represents the drain 420, and the channel terminal 416-2 represents the source 418.

The transistor 314 can have parasitic capacitance 326, which exists between the gate 414 and the channel terminal 416-2 (e.g., the drain 420). This parasitic capacitance 326 is based at least in part on parasitic capacitances of a back-end-of-line (BEOL) of the amplifier 124 and parasitic capacitances between the gate 414 and any electrical contacts 412 disposed on the surface of the channel terminal region 404-2.

One aspect of reducing the parasitic capacitance 326 reduces the quantity of electrical contacts 412 deposited on the channel terminal region 404-2 such that this quantity is less than a quantity of electrical contacts 412 deposited on the channel terminal region 404-1. For example, the quantity of electrical contacts 412 deposited on the channel terminal region 404-2 can be between 0%-50% of the quantity of electrical contacts 412 deposited on the channel terminal region 404-1. In some implementations, the channel terminal region 404-2 represents an "electrical-contact-free region" in which no electrical contacts are deposited on the surface of the channel terminal region 404-2. In other implementations, one or more electrical contacts 412 are deposited on the channel terminal region 404-2. In general, a total surface area of the channel terminal region 404-2 that abuts the electrical contact(s) 412 is less than a total surface area of the channel terminal region 404-1 that abuts the electrical contact(s) 412. The channel terminal regions 404-2 of the transistors 314 and 316 form a floating region, which is further described with respect to FIG. 5.

Figure 5:
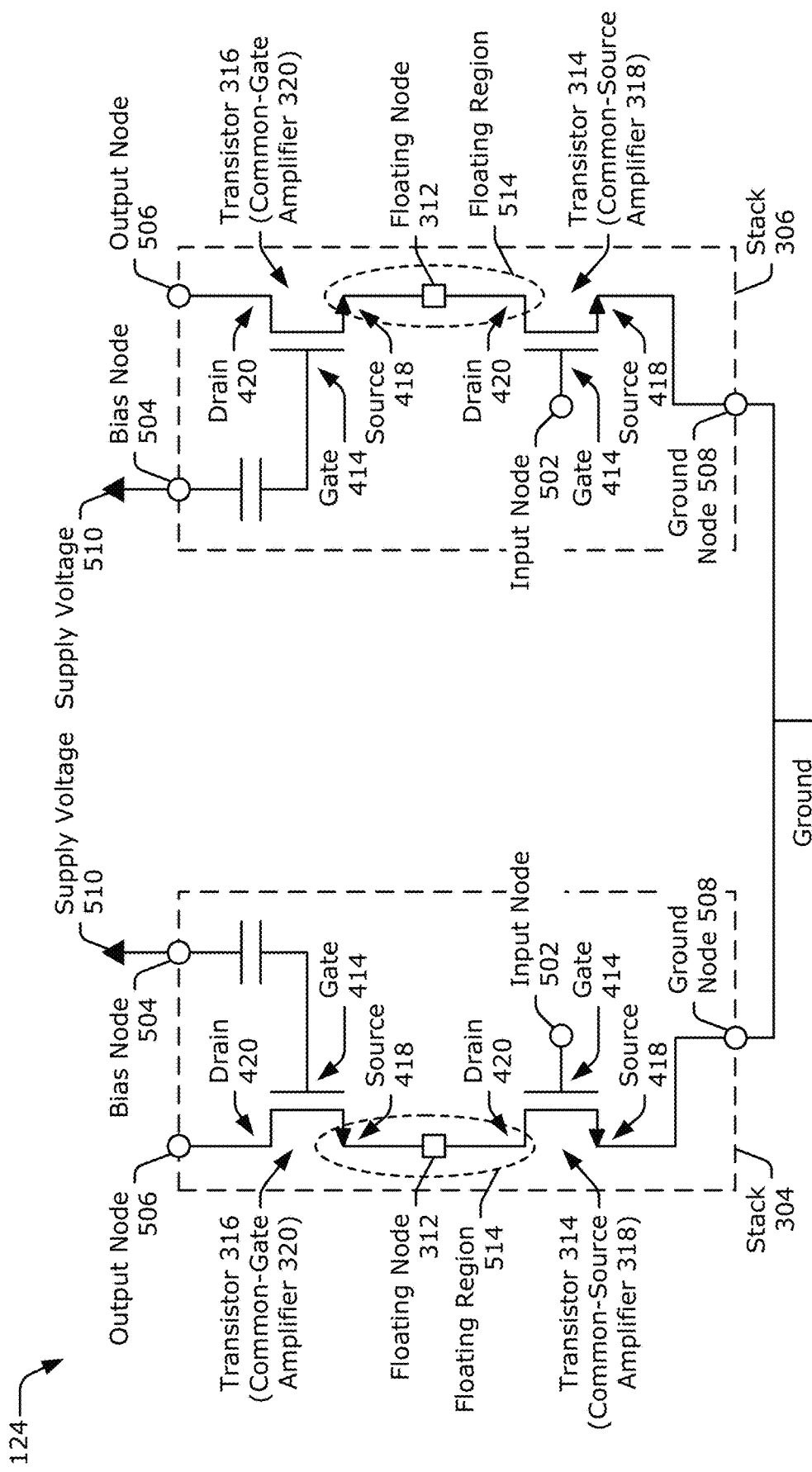
FIG. 5 illustrates an example implementation of an amplifier that reduces parasitic capacitance.

FIG. 5 illustrates an example implementation of the amplifier 124. In the depicted configuration, the amplifier 124 includes the stacks 304 and 306. Each stack 304 and 306 includes the transistors 314 and 316, which are configured as a common-source amplifier 318 and a common-gate amplifier 320, respectively. In FIG. 5, the transistors 314 and 316 are shown to be implemented as NMOSFETs. Other implementations, however, are also possible. For example, the transistors 314 can be SLVT-NMOSFETs, and the transistors 316 can be ED-NMOSFETs.

The transistors 314 and 316 are coupled together within each stack 304 and 306 at the floating node 312. In particular, the drain 420 of the transistor 314 is coupled to the source 418 of the transistor 316 at the floating node 312. The drain 420 of the transistor 314 and the source 418 of the transistor 316 are associated with the channel terminal regions 404-2. The channel terminal regions 404-2 of the transistors 314 and 316 can form a floating region 514. In some cases, the floating region 514 represents a shared region, which represents both the drain 420 of the transistor 314 and the source 418 of the transistor 316. Implementing the floating region 514 as a shared region can conserve space within the amplifier 124. The floating region 514 represents a conducting metal-silicided diffusion region. In particular, a thin layer of silicide, such as nickel silicide, can be present on a surface of the floating region 514.

Each stack 304 and 306 also includes an input node 502, a bias node 504, an output node 506, and a ground node 508.

The input node 502 is coupled to the gate 414 of the transistor 314. The bias node 504 is coupled to the gate 414 of the transistor 316. The stacks 304 and 306 can include at least one capacitor, which is coupled between the gate 414 of the transistor 316 and the bias node 504. The output node 506 is coupled to the drain 420 of the transistor 316. Although not explicitly shown, the output node 506 can also be coupled to a load and a power supply node. The ground node 508 is coupled to the source 418 of the transistor 314.

During operation, the input node 502 accepts a differential input signal (e.g., the transmit signal 222). The output node 506 provides a differential output signal (e.g., the amplified transmit signal 226), which is amplified relative to the differential input signal. The bias node 504 is coupled to a supply voltage 510 and provides a bias voltage to the gate 414 of the transistor 316. The ground node 508 couples the source 418 of the transistor 314 to a ground 512. Although the amplifier 124 is shown to include one pair of stacks in FIG. 5, some implementations of the amplifier 124 can have additional pairs of stacks, as further described with respect to FIG. 6.

Figure 6:
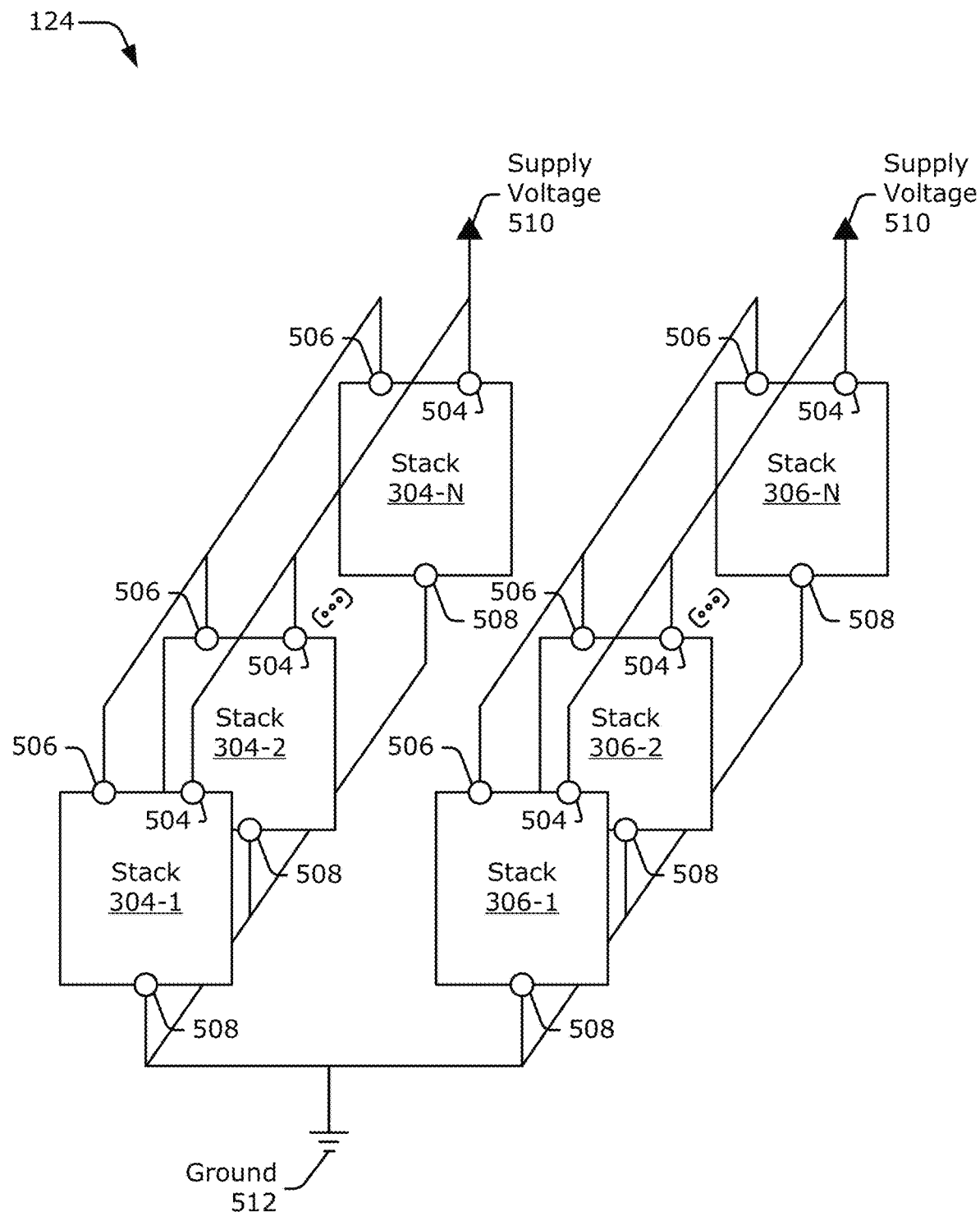
FIG. 6 illustrates another example implementation of an amplifier that reduces parasitic capacitance.

FIG. 6 illustrates another example implementation of the amplifier 124. In the depicted configuration, the amplifier 124 includes multiple pairs of stacks. In the depicted configuration, the amplifier 124 includes stacks 304-1, 304-2 . . . 304-N, where N represents a positive integer. The amplifier 124 also includes stacks 306-1, 306-2 . . . 306-N. Each pair of stacks includes one of the stacks 304-1 to 304-N and one of the stacks 306-1 to 306-N. For example, a first pair of stacks includes stacks 304-1 and 306-1, a second pair of stacks includes stacks 304-2 and 306-2, and an $N^{th}$ pair of stacks includes stacks 304-N and 306-N.

The stacks 304-1 to 304-N are coupled together in parallel, and the stacks 306-1 to 306-N are coupled together in parallel. In particular, the stacks 304-1 to 304-N are coupled together at the input node 502 (not shown), the bias node 504, the output node 506, and the ground node 508. Also, the stacks 306-1 to 306-N are coupled together at the input node 502 (not shown), the bias node 504, the output node 506, and the ground node 508. To reduce the parasitic capacitance 326, a quantity of electrical contacts 412 associated with the floating region 514 of the amplifier 124 is limited, as further described with respect to FIG. 7.

Figure 7:
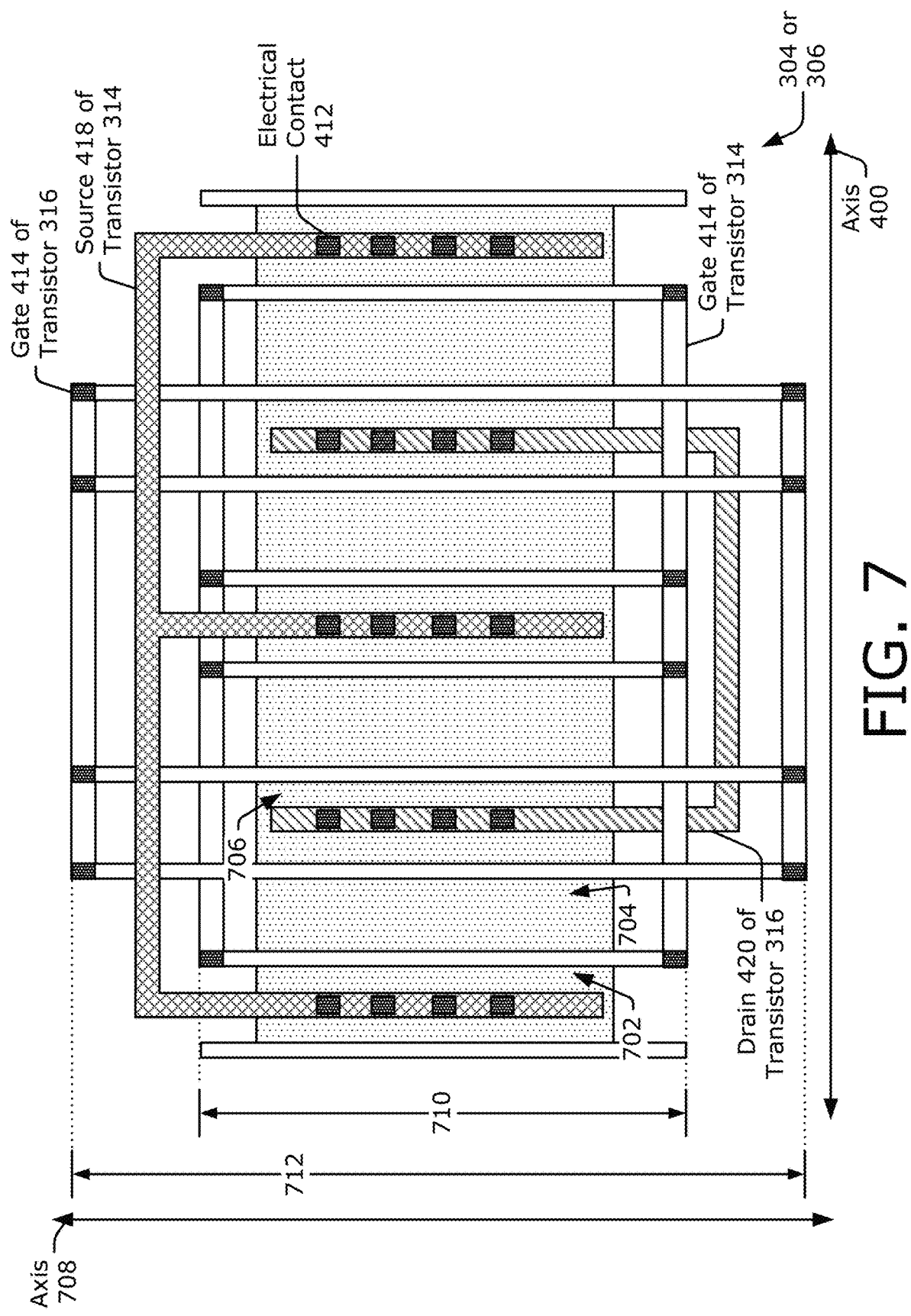
FIG. 7 illustrates an example layout of one of the stacks of an amplifier that reduces parasitic capacitance.

FIG. 7 illustrates an example layout of the stack 304 or 306. In the depicted configuration, the transistors 314 and 316 are implemented as multi-finger transistors. With this multi-finger design, multiple pairs of parallel stacks can be implemented in a manner that conserves space. The channel terminals 416-1 and 416-2 and gates 414 of the transistors 314 and 316 are arranged or positioned along the axis 400. Starting from the left side of FIG. 7 and moving to the right along the axis 400, the stack 304 or 306 includes a first region 702, which is a channel terminal region 404-1. Disposed on a surface of the first region 702 are electrical contacts 412, which connect the first region 702 to at least one metal layer of the transistor 314. The first region 702 and the electrical contacts 412 form, at least in part, the source 418 of the transistor 314.

To the right of the source 418 of the transistor 314 is the gate 414 of the transistor 314. A second region 704 to the right of the gate 414 of the transistor 314 represents the floating region 514 (e.g., the drain 420 of the transistor 314 and the source 418 of the transistor 316). The floating region 514 is positioned between the gate 414 of the transistor 314 and the gate 414 of the transistor 316. The floating region 514 can be formed with a single type of doping, such as an n+ doping type.

A third region 706 represents another channel terminal region 404-1. In particular, the third region 706 corresponds to the drain 420 of the transistor 316. Disposed on a surface of the third region 706 are electrical contacts 412, which connect the third region 706 to at least one metal layer of the transistor 316. The third region 706 and the electrical contacts 412 form, at least in part, the drain 420 of the transistor 316.

In some implementations, widths of the gates 414 are different between the transistors 314 and 316. Consider an axis 708, which is approximately perpendicular to the axis 400. Along the axis 708, the fingers associated with the gate 414 of the transistor 314 have a width 710. Also, the fingers associated with the gate 414 of the transistor 316 have a width 712. As shown in FIG. 7, the width 712 is greater than the width 710. The larger width 712 can enhance stability performance of the amplifier 124 by effectively adding resistance between the gate 414 of the transistor 316 and the bias node 504.

Consider a case in which FIG. 7 illustrates the stack 304. Although not explicitly shown, a layout of the stack 306 can be positioned to the right or left of the stack 304 along the axis 400. In some implementations, the source 418 of the transistor 314 of the stack 304 can be extended along the axis 400 and connect to the corresponding source 418 of the transistor 314 of the stack 306.

To reduce the parasitic capacitance 326, fewer electrical contacts 412 are disposed on the floating region 514 relative to the other channel terminal regions 404-1. As an example, the quantity of electrical contacts 412 disposed on the floating region 514 can be 0, 1, 2, 4, 6, or 10 while the quantity of electrical contacts 412 disposed on one of the other channel terminal regions 404-1 is greater. As such, a total surface area of the floating region 514 that abuts the electrical contacts 412 is less than a total surface area of one of the channel terminal regions 404-1 that abuts the electrical contacts 412. In this example, the floating regions 514 (e.g., the second region 704) are electrical-contact-free regions in which no electrical contacts are disposed on the surface of the floating regions 514. In other words, the floating regions 514 lack or are devoid of electrical contacts 412. Sometimes, this aspect of reducing parasitic capacitance can be sufficient for enabling the amplifier 124 to realize a desired level of performance without the need for neutralization capacitors. If additional parasitic capacitance reduction is required to achieve the desired level of performance, at least one electrical contact 412 can be deposited on each of the floating regions 514 to enable the use of the capacitors 328, as further described with respect to FIGS. 8 and 9.

Figure 8:
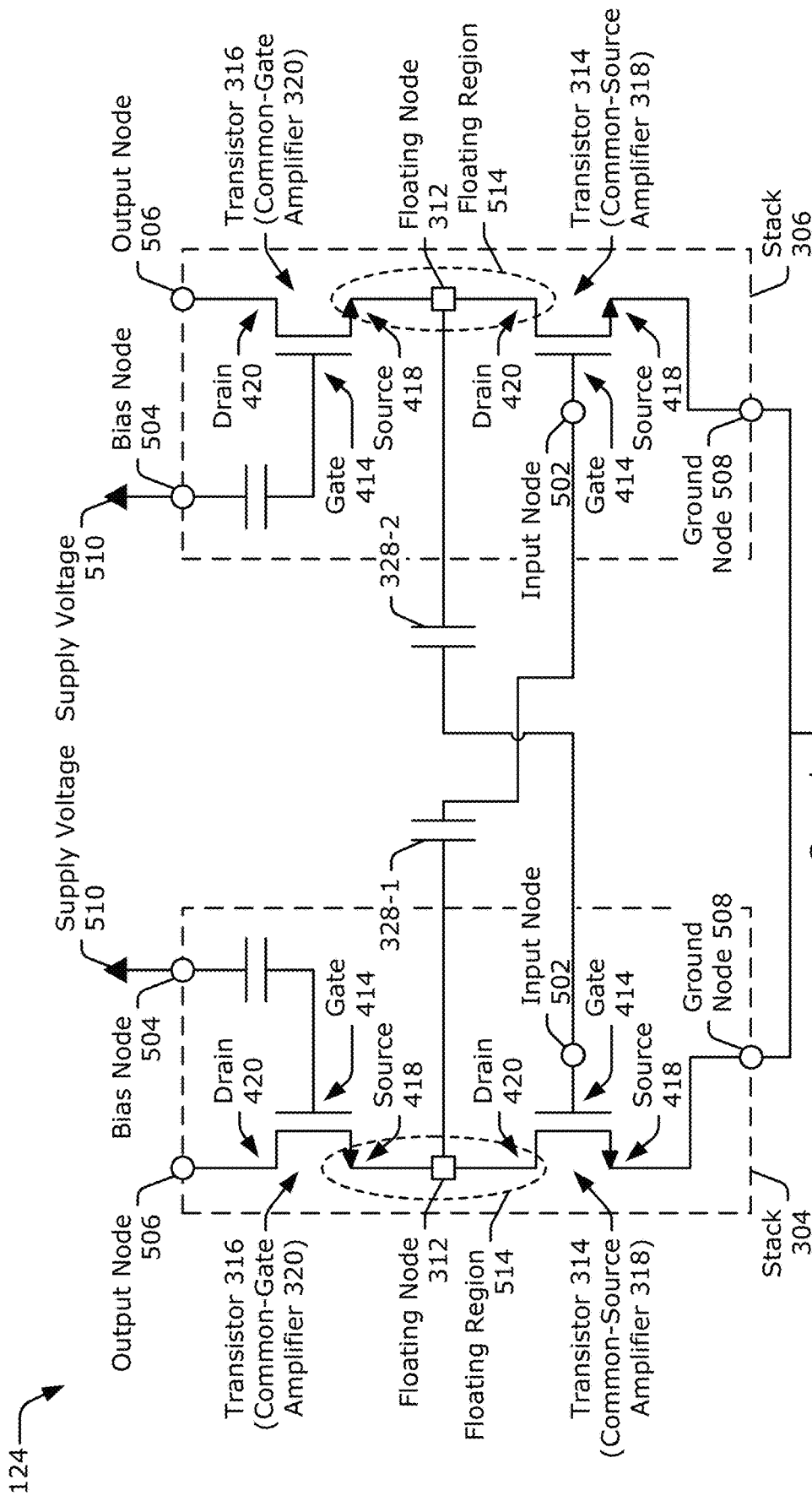
FIG. 8 illustrates yet another example implementation of an amplifier that reduces parasitic capacitance.

FIG. 8 illustrates yet another example implementation of the amplifier 124. The amplifier 124 of FIG. 8 is similar to the amplifier 124 of FIG. 5, with the addition of two capacitors 328-1 and 328-2. In this case, at least one electrical contact is disposed on the surface of each of the floating regions 514 of the stacks 304 and 306. In the depicted configuration, the capacitor 328-1 is coupled between the at least one electrical contact disposed on the surface of the floating region 514 of the stack 304 and the gate 414 of the common-source amplifier 318 of the stack 306. Similarly, the capacitor 328-2 is coupled between the at least one electrical contact disposed on the surface of the floating region 514 of the stack 306 and the gate 414 of the common-source amplifier 318 of the stack 304. In this way, the capacitors 328-1 and 328-2 can further reduce the parasitic capacitance 326 within the common-source amplifiers 318. To avoid increasing a footprint of the amplifier 124, the capacitors 328-1 and 328-2 can be integrated within the layout of the stacks 304 and 306, as further described with respect to FIGS. 9 and 10.

Figure 9:
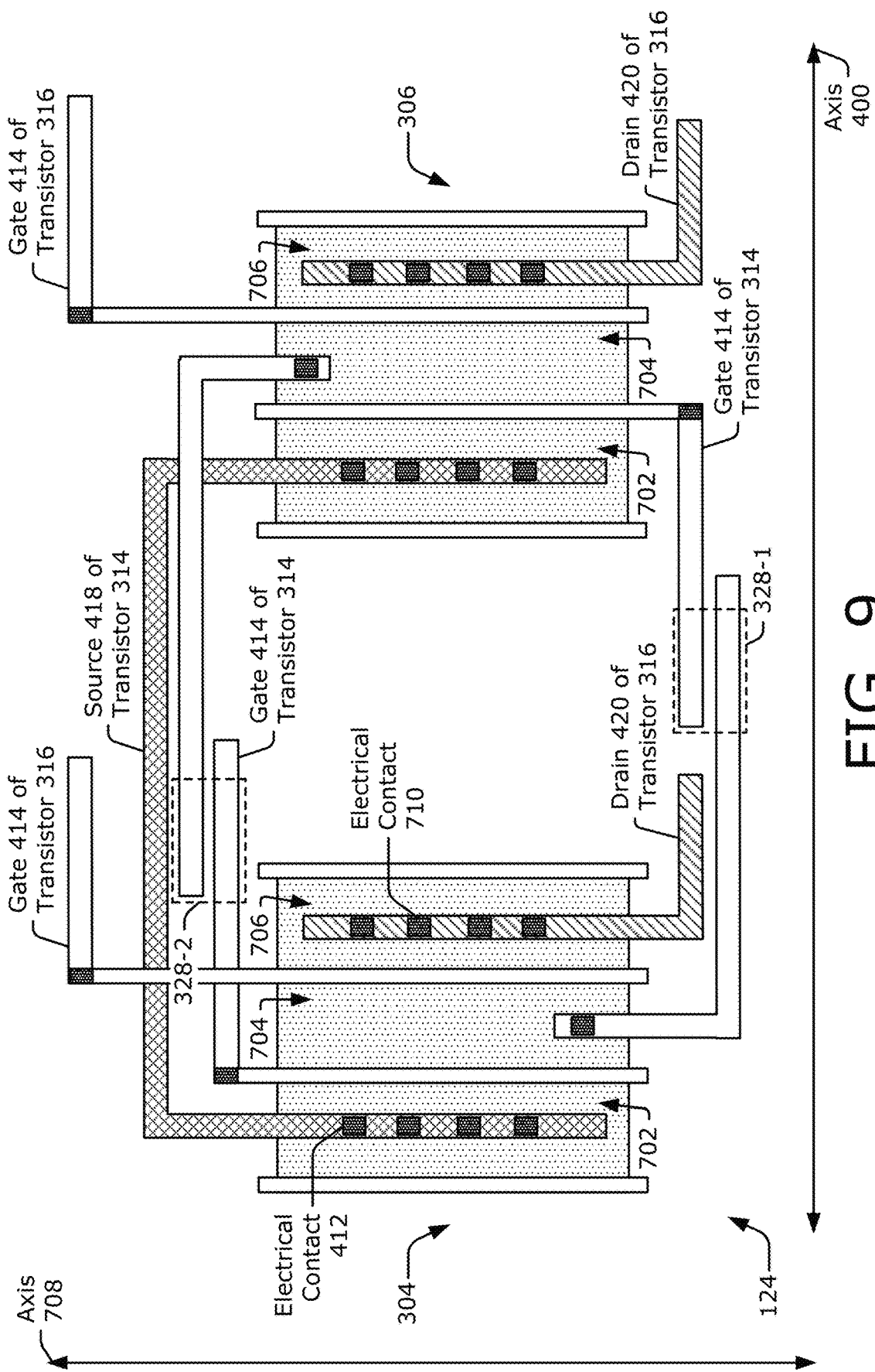
FIG. 9 illustrates an example layout of an amplifier that reduces parasitic capacitance.

FIG. 9 illustrates an example layout of the amplifier 124, with the stack 304 shown on the left and the stack 306 shown on the right. The layout of each stack 304 and 306 in FIG. 9 is similar to the layout shown in FIG. 7, however the stacks 304 and 306 in FIG. 9 are shown with fewer fingers for simplicity. The capacitors 328-1 and 328-2 can be integrated within a footprint of the amplifier 124. In this case, the capacitors 328-1 and 328-2 are implemented, at least in part, using the existing back-end-of-line of the amplifier 124. In this manner, the capacitors 328-1 and 328-2 do not appreciably increase a footprint of the amplifier 124. Also, because the floating regions 514 (e.g., regions 704) have fewer electrical contacts 412 than the other channel terminal regions 404-1 (e.g., regions 702 and 706), capacitances of the capacitors 328-1 and 328-2 can also be smaller compared to the capacitance of neutralization capacitors of other amplifiers that have a greater quantity of electrical contacts 412 disposed on the floating regions 514. With the described techniques, the parasitic capacitance 326 within the amplifier 124 can be meaningfully reduced without substantially increasing a footprint of the amplifier 124. The capacitors 328-1 and 328-2 are further described with respect to FIG. 10.

Figure 10:
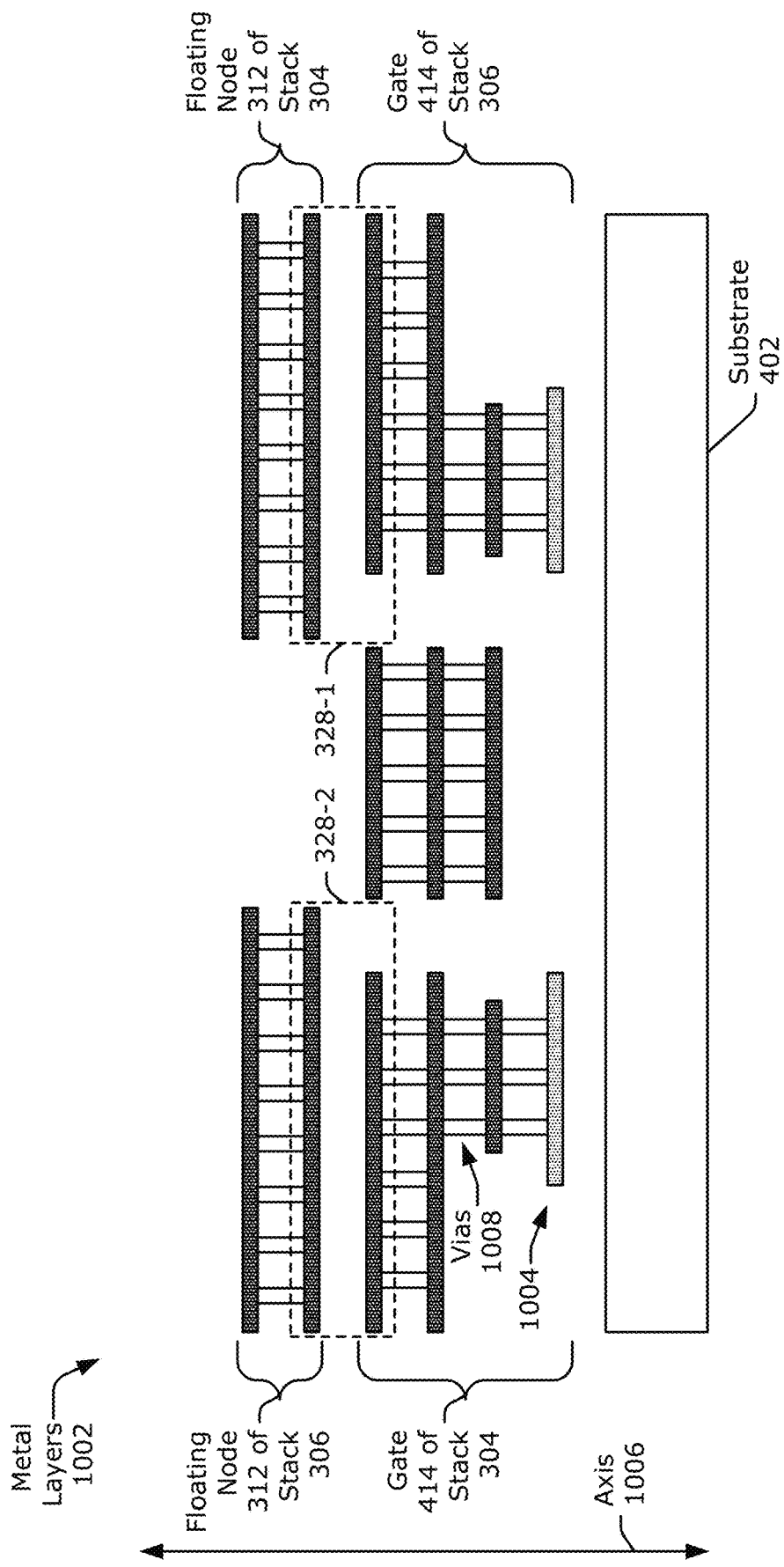
FIG. 10 illustrates an example vertical layout of an amplifier that reduces parasitic capacitance.

FIG. 10 illustrates portions of the stacks 304 and 306 as implemented using multiple metal layers 1002 and at least one polysilicon layer 1004 disposed "above" the substrate 402 along an axis 1006. The axis 1006 is orthogonal to the axes 400 and 708. Vias 1008 connect the metal layers 1002 and the polysilicon layer 1004 together. For example, a first set of vias 1008 connect the polysilicon layer 1004 and a first set of metal layers 1002 together to form the gate 414. A second set of vias 1008 connect a second set of metal layers 1002 together to form the floating node 312. Although five metal layers 1002 are explicitly shown in FIG. 10, the stacks 304 and 306 can be implemented with any quantity of metal layers 1002.

In the depicted configuration, the capacitors 328-1 and 328-2 are formed by overlapping one of the metal layers 1002 associated with the appropriate floating node 312 and one of the metal layers 1002 associated with the appropriate gate 414 along the axis 1006. In particular, the capacitor 328-1 is formed by overlapping a metal layer 1002 associated with the floating node 312 of the stack 304 with a metal layer 1002 associated with the gate 414 of the stack 306. Also, the capacitor 328-2 is formed by overlapping a metal layer 1002 associated with the floating node 312 of the stack 306 with a metal layer 1002 associated with the gate 414 of the stack 304. In this way, the capacitors 328-1 and 328-2 are integrated within a layout of the first and second stacks 304 and 306 using the metal layers 1002. Other possible implementations of the capacitors 328-1 and 328-2 using the metal layers 1002 are also possible. By using the back-end-of-line of the amplifier 124, the capacitors 328-1 and 328-2 can be integrated without increasing a footprint of the amplifier 124 along the axes 400 and 708.

Some aspects are described below.

Aspect 1: An apparatus comprising:
an amplifier having a differential cascode configuration, the amplifier comprising at least two stacks, each stack of the at least two stacks comprising:
a first transistor configured to operate as an input stage of the amplifier; and a second transistor coupled to the first transistor at a floating node, the second transistor configured to operate as a cascode stage of the amplifier, wherein:

the first and second transistors each comprise two channel terminal regions having a doping type that is uniform across the two channel terminal regions, the two channel terminal regions comprising a first channel terminal region and a second channel terminal region;

a surface of the first channel terminal region of the first transistor abuts a first quantity of electrical contacts;

a surface of the first channel terminal region of the second transistor abuts a second quantity of electrical contacts;

the second channel terminal regions of the first and second transistors form a floating region at the floating node; and each of the first quantity of electrical contacts and the second quantity of electrical contacts is greater than a third quantity of electrical contacts abutting a surface of the floating region.

Aspect 2: The apparatus of aspect 1, wherein:

a total surface area of the floating region that abuts the third quantity of electrical contacts is less than a total surface area of the first channel terminal region of the first transistor that abuts the first quantity of electrical contacts; and the total surface area of the floating region that abuts the third quantity of electrical contacts is less than a total surface are of the first channel terminal region of the second transistor that abuts the second quantity of electrical contacts.

Aspect 3: The apparatus of aspect 1 or 2, wherein the third quantity of contacts is equal to zero.

Aspect 4: The apparatus of aspect 3, wherein:

each surface of the first channel terminal regions of the first and second transistors abuts at least one electrical contact; and the surface of the floating region does not abut an electrical contact.

Aspect 5: The apparatus of any previous aspect, wherein:

the third quantity of electrical contacts is greater than zero;

the at least two stacks comprise a first stack and a second stack;

the surface of the floating region of the first stack abuts at least one first electrical contact;

the surface of the floating region of the second stack abuts at least one second electrical contact; and the amplifier comprises:
 a first capacitor coupled between the at least one first electrical contact and a gate terminal of the first transistor of the second stack; and
 a second capacitor coupled between the at least one second electrical contact and a gate terminal of the first transistor of the first stack.

Aspect 6: The apparatus of aspect 5, wherein the first and second capacitors are integrated within a layout of the first and second stacks.

Aspect 7: The apparatus of any previous aspect, wherein:

the first transistor comprises a common-source amplifier; and the second transistor comprises a common-gate amplifier.

Aspect 8: The apparatus of any previous aspect, wherein the first transistor and the second transistor are symmetrical for each stack of the at least two stacks.

Aspect 9: The apparatus of any one of aspects 1-7, wherein the first transistor and the second transistor are asymmetrical for each stack of the at least two stacks.

Aspect 10: The apparatus of aspect 9, wherein:

the first transistor comprises an extended-drain n-channel metal-oxide-semiconductor field-effect transistor; and the second transistor comprises a super-low threshold-voltage n-channel metal-oxide-semiconductor field-effect transistor.

Aspect 11: The apparatus of any previous aspect, wherein:

the amplifier comprises a substrate;

the two channel terminal regions of the first and second transistors are positioned within the substrate along a first axis;

the first and second transistors each comprise at least one metal layer that forms one or more fingers associated with a gate terminal, the one or more fingers having a width along a second axis that is substantially perpendicular to the first axis; and the width of the one or more fingers of the second transistor is greater than the width of the one or more fingers of the first transistor.

Aspect 12: The apparatus of any previous aspect, wherein the floating region comprises a silicided diffusion region positioned between a gate of the first transistor and a gate of the second transistor.

Aspect 13: The apparatus of any previous aspect, wherein the at least two stacks comprise multiple pairs of stacks coupled together in parallel.

Aspect 14: The apparatus of any previous aspect, further comprising:

a wireless transceiver coupled to at least one antenna, the wireless transceiver comprising the amplifier and configured to amplify, using the amplifier, a wireless signal communicated via the at least one antenna.

Aspect 15: The apparatus of aspect 14, wherein the amplifier comprises a power amplifier.

Aspect 16: An apparatus comprising:

means for amplifying a differential signal using a differential cascode configuration, the means for amplifying comprising:
 an input stage; and
 a cascode stage coupled to the input stage at a floating node, the input stage and the cascode stage each comprising two channel terminal regions having a doping type that is uniform across the two channel terminal regions, one of the two channel terminal regions of the input stage and one of the two channel terminal regions of the cascode stage forming a floating region at the floating node; and means for setting a parasitic capacitance between a gate terminal of the input stage and the one of the two channel terminal regions of the input stage based on a quantity of electrical contacts that abut a surface of the floating region.

Aspect 17: The apparatus of aspect 16, wherein:

another one of the two channel terminal regions of the input stage abuts a first quantity of electrical contacts;

another one of the two channel terminal regions of the cascode stage abuts a second quantity of electrical contacts; and each of the first quantity of electrical contacts and the second quantity of electrical contacts is greater than a third quantity of electrical contacts abutting the surface of the floating region.

Aspect 18: The apparatus of aspect 17, wherein the quantity of electrical contacts that abut the surface of the floating region is equal to zero.

Aspect 19: The apparatus of aspect 17, wherein:
the quantity of electrical contacts that abut the surface of the floating region is greater than zero; and
the means for setting comprises capacitive means for reducing at least a portion of the parasitic capacitance, the capacitive means coupled to the floating region via electrical contacts.

Aspect 20: The apparatus of any one of aspects 16-19, wherein:
the input stage and the cascode stage form a stack of the means for amplifying; and
the input stage and the cascode stage of the stack are symmetrical.

Aspect 21: The apparatus of any one of aspects 16-19, wherein:
the input stage and the cascode stage form a stack of the means for amplifying; and
the input stage and the cascode stage of the stack are asymmetrical.

Aspect 22: An apparatus comprising:
an amplifier having a differential cascode configuration, the amplifier comprising at least two stacks, each stack of the at least two stacks comprising:
  a first transistor configured to operate as an input stage of the amplifier; and
  a second transistor coupled to the first transistor at a floating node, the second transistor configured to operate as a cascode stage of the amplifier, wherein:
the first transistor and the second transistor each comprise two channel terminal regions having a doping type that is uniform across the two channel terminal regions, the two channel terminal regions comprising a first channel terminal region and a second channel terminal region;
the second channel terminal regions of the first and second transistors form a floating region at the floating node; and
the floating region comprises an electrical-contact-free region.

Aspect 23: The apparatus of aspect 22, wherein:
each surface of the first channel terminal regions of the first and second transistors abuts at least one electrical contact; and
a surface of the floating region does not abut an electrical contact.

Aspect 24: The apparatus of aspect 22 or 23, wherein:
the first transistor comprises a common-source amplifier; and
the second transistor comprises a common-gate amplifier.

Aspect 25: The apparatus of any one of aspects 22-24, wherein the first transistor and the second transistor are symmetrical for each stack of the at least two stacks.

Aspect 26: The apparatus of any one of aspects 22-24, wherein the first transistor and the second transistor are asymmetrical for each stack of the at least two stacks.

Aspect 27: The apparatus of any one of aspects 22-26, wherein:
the amplifier comprises a substrate;
the two channel terminal regions of the first and second transistors are positioned within the substrate along a first axis;
the first and second transistors each comprise at least one metal layer that forms one or more fingers associated with a gate terminal, the one or more fingers having a width along a second axis that is substantially perpendicular to the first axis; and
the width of the one or more fingers of the second transistor is greater than the width of the one or more fingers of the first transistor.

Aspect 28: An apparatus comprising:
an amplifier having a differential cascode configuration, the amplifier comprising at least two stacks, each stack of the at least two stacks comprising:
  a first transistor configured to operate as an input stage of the amplifier; and
  a second transistor coupled to the first transistor at a floating node, the second transistor configured to operate as a cascode stage of the amplifier;
a first capacitor coupled between a gate of the first transistor of a first stack of the at least two stacks and the floating node of a second stack of the at least two stacks; and
a second capacitor coupled between a gate of the first transistor of the second stack and the floating node of the first stack, wherein:
the first transistor and the second transistor each comprise two channel terminal regions having a doping type that is uniform across the two channel terminal regions, the two channel terminal regions comprising a first channel terminal region and a second channel terminal region;
surfaces of the second channel terminal regions of the first and second transistors form a floating region at the floating node; and
each of a quantity of electrical contacts abutting the first channel terminal region of the first transistor and a quantity of electrical contacts abutting the first channel terminal region of the second transistor is greater than a quantity of electrical contacts abutting a surface of the floating region.

Aspect 29: The apparatus of aspect 28, wherein the first and second capacitors are integrated within a layout of the first and second stacks using metal interconnect layers associated with the first and second stacks.

Aspect 30: The apparatus of aspect 28 or 29, wherein:
the amplifier comprises a substrate;
the two channel terminal regions of the first and second transistors are positioned within the substrate along a first axis;
the first and second transistors each comprise at least one metal layer that forms one or more fingers associated with a gate terminal, the one or more fingers having a width along a second axis that is substantially perpendicular to the first axis; and
the width of the one or more fingers of the second transistor is greater than the width of the one or more fingers of the first transistor.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description.

Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
an amplifier having a differential cascode configuration, the amplifier comprising at least two stacks, each stack of the at least two stacks comprising:
a first transistor configured to operate as an input stage of the amplifier; and
a second transistor coupled to the first transistor at a floating node, the second transistor configured to operate as a cascode stage of the amplifier, wherein:
the first and second transistors each comprise two channel terminal regions having a doping type that is uniform across the two channel terminal regions, the two channel terminal regions comprising a first channel terminal region and a second channel terminal region;
a surface of the first channel terminal region of the first transistor abuts a first quantity of electrical contacts;
a surface of the first channel terminal region of the second transistor abuts a second quantity of electrical contacts;
the second channel terminal regions of the first and second transistors form a floating region at the floating node; and
each of the first quantity of electrical contacts and the second quantity of electrical contacts is greater than a third quantity of electrical contacts abutting a surface of the floating region to reduce parasitic capacitance at the second channel terminal region.

2. The apparatus of claim 1, wherein:
a total surface area of the floating region that abuts the third quantity of electrical contacts is less than a total surface area of the first channel terminal region of the first transistor that abuts the first quantity of electrical contacts; and
the total surface area of the floating region that abuts the third quantity of electrical contacts is less than a total surface are of the first channel terminal region of the second transistor that abuts the second quantity of electrical contacts.

3. The apparatus of claim 1, wherein the third quantity of contacts is equal to zero.

4. The apparatus of claim 3, wherein:
each surface of the first channel terminal regions of the first and second transistors abuts at least one electrical contact; and
the surface of the floating region does not abut an electrical contact.

5. The apparatus of claim 1, wherein:
the third quantity of electrical contacts is greater than zero;
the at least two stacks comprise a first stack and a second stack;
the surface of the floating region of the first stack abuts at least one first electrical contact;
the surface of the floating region of the second stack abuts at least one second electrical contact; and
the amplifier comprises:
a first capacitor coupled between the at least one first electrical contact and a gate terminal of the first transistor of the second stack; and
a second capacitor coupled between the at least one second electrical contact and a gate terminal of the first transistor of the first stack.

6. The apparatus of claim 5, wherein the first and second capacitors are integrated within a layout of the first and second stacks.

7. The apparatus of claim 1, wherein:
the first transistor comprises a common-source amplifier; and
the second transistor comprises a common-gate amplifier.

8. The apparatus of claim 1, wherein the first transistor and the second transistor are symmetrical for each stack of the at least two stacks.

9. The apparatus of claim 1, wherein the first transistor and the second transistor are asymmetrical for each stack of the at least two stacks.

10. The apparatus of claim 9, wherein:
the first transistor comprises an extended-drain n-channel metal-oxide-semiconductor field-effect transistor; and
the second transistor comprises a super-low threshold-voltage n-channel metal-oxide-semiconductor field-effect transistor.

11. The apparatus of claim 1, wherein:
the amplifier comprises a substrate;
the two channel terminal regions of the first and second transistors are positioned within the substrate along a first axis;
the first and second transistors each comprise at least one metal layer that forms one or more fingers associated with a gate terminal, the one or more fingers having a width along a second axis that is substantially perpendicular to the first axis; and
the width of the one or more fingers of the second transistor is greater than the width of the one or more fingers of the first transistor.

12. The apparatus of claim 1, wherein the floating region comprises a silicided diffusion region positioned between a gate of the first transistor and a gate of the second transistor.

13. The apparatus of claim 1, wherein the at least two stacks comprise multiple pairs of stacks coupled together in parallel.

14. The apparatus of claim 1, further comprising:
a wireless transceiver coupled to at least one antenna, the wireless transceiver comprising the amplifier and configured to amplify, using the amplifier, a wireless signal communicated via the at least one antenna.

15. The apparatus of claim 14, wherein the amplifier comprises a power amplifier.

16. An apparatus comprising:
means for amplifying a differential signal using a differential cascode configuration, the means for amplifying comprising:
an input stage; and
a cascode stage coupled to the input stage at a floating node, the input stage and the cascode stage each comprising two channel terminal regions having a doping type that is uniform across the two channel terminal regions, the two channel terminal regions comprising a first channel terminal region and a second channel terminal region, the second channel terminal region of the input stage and the second channel terminal region of the cascode stage forming a floating region at the floating node; and
means for reducing a parasitic capacitance between a gate terminal of the input stage and the second channel terminal region of the input stage based on a quantity of electrical contacts that abut a surface of the floating region being less than a quantity of electrical contacts that abut a surface of the first channel terminal region.

17. The apparatus of claim 16, wherein the quantity of electrical contacts abutting the surface of the floating region is equal to zero.

18. The apparatus of claim 16, wherein:
the quantity of electrical contacts abutting the surface of the floating region is greater than zero; and
the means for setting comprises capacitive means for reducing at least a portion of the parasitic capacitance, the capacitive means coupled to the floating region via electrical contacts.

19. The apparatus of claim 16, wherein:
the input stage and the cascode stage form a stack of the means for amplifying; and
the input stage and the cascode stage of the stack are symmetrical.

20. The apparatus of claim 16, wherein:
the input stage and the cascode stage form a stack of the means for amplifying; and
the input stage and the cascode stage of the stack are asymmetrical.

21. An apparatus comprising:
an amplifier having a differential cascode configuration, the amplifier comprising at least two stacks, each stack of the at least two stacks comprising:
a first transistor configured to operate as an input stage of the amplifier; and
a second transistor coupled to the first transistor at a floating node, the second transistor configured to operate as a cascode stage of the amplifier;
a first capacitor coupled between a gate of the first transistor of a first stack of the at least two stacks and the floating node of a second stack of the at least two stacks; and
a second capacitor coupled between a gate of the first transistor of the second stack and the floating node of the first stack, wherein:
the first transistor and the second transistor each comprise two channel terminal regions having a doping type that is uniform across the two channel terminal regions, the two channel terminal regions comprising a first channel terminal region and a second channel terminal region;
surfaces of the second channel terminal regions of the first and second transistors form a floating region at the floating node; and
each of a quantity of electrical contacts abutting the first channel terminal region of the first transistor and a quantity of electrical contacts abutting the first channel terminal region of the second transistor is greater than a quantity of electrical contacts abutting a surface of the floating region to reduce parasitic capacitance at the second channel terminal region.

22. The apparatus of claim 21, wherein the first and second capacitors are integrated within a layout of the first and second stacks using metal interconnect layers associated with the first and second stacks.

23. The apparatus of claim 21, wherein:
the amplifier comprises a substrate;
the two channel terminal regions of the first and second transistors are positioned within the substrate along a first axis;
the first and second transistors each comprise at least one metal layer that forms one or more fingers associated with a gate terminal, the one or more fingers having a width along a second axis that is substantially perpendicular to the first axis; and
the width of the one or more fingers of the second transistor is greater than the width of the one or more fingers of the first transistor.

* * * * *